United States Patent
Saeki

(10) Patent No.: US 11,456,715 B1
(45) Date of Patent: Sep. 27, 2022

(54) OPERATIONAL AMPLIFIER WITH REDUCED INPUT CAPACITANCE

(71) Applicant: Synaptics Incorporated, San Jose, CA (US)

(72) Inventor: Yutaka Saeki, Kanagawa (JP)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 17/565,370

(22) Filed: Dec. 29, 2021

Related U.S. Application Data

(63) Continuation of application No. 17/359,257, filed on Jun. 25, 2021, now Pat. No. 11,251,761.

(51) Int. Cl.
G06F 3/0484 (2022.01)
G06F 3/0488 (2022.01)
G06F 3/0485 (2022.01)
H03F 3/45 (2006.01)
G09G 3/20 (2006.01)

(52) U.S. Cl.
CPC .......... H03F 3/45273 (2013.01); G09G 3/20 (2013.01); H03F 3/45269 (2013.01); G09G 2300/08 (2013.01); G09G 2310/027 (2013.01); G09G 2310/0291 (2013.01)

(58) Field of Classification Search
CPC ... H03F 3/45273; H03F 3/45269; G09G 3/20; G09G 2300/08; G09G 2310/027; G09G 2310/0291
See application file for complete search history.

(56) References Cited

U.S. PATENT DOCUMENTS

| | | | |
|---|---|---|---|
| 2014/0340288 A1* | 11/2014 | Yamashita | G09G 3/3266 345/76 |
| 2018/0061307 A1* | 3/2018 | Inoue | H01L 27/3211 |
| 2019/0068148 A1* | 2/2019 | Oishi | H03F 3/45475 |
| 2019/0108809 A1* | 4/2019 | Zheng | G11C 19/287 |
| 2020/0020266 A1* | 1/2020 | Feng | G11C 19/28 |
| 2020/0312264 A1* | 10/2020 | Tsuchi | G09G 3/3688 |

* cited by examiner

*Primary Examiner* — Andrew Sasinowski
(74) *Attorney, Agent, or Firm* — Ferguson Braswell Fraser Kubasta PC

(57) ABSTRACT

An operational amplifier includes an output transistor having a gate coupled to an output node, at least one intermediate transistor each having a common gate node, an input transistor having a gate coupled to an input node, and a load device coupled to sources of the output transistor, the at least one intermediate transistor, and the input transistor. The operational amplifier further includes an output stage coupled to the output node, configured to drive the voltage on the output node based on currents through the output transistor, the at least one intermediate transistors, and the input transistor. The operational amplifier further includes a first switch coupled between the common gate node of the at least one intermediate transistor and the gate of the input transistor, and a second switch coupled between the output node and the common gate node of the at least one intermediate transistors.

14 Claims, 12 Drawing Sheets

FIG. 7B

| Period | #1 | #2 | #3 | #4 | #5 |
|---|---|---|---|---|---|
| SW1 | ON | OFF | ON | OFF | ON |
| SW2 | OFF | ON | OFF | ON | OFF |
| SW3 | ON | OFF | ON | OFF | ON |
| SW4 | OFF | ON | OFF | ON | OFF |
| SW5 | ON | OFF | ON | OFF | ON |
| SW6 | OFF | ON | OFF | ON | OFF |

OPERATIONAL AMPLIFIER WITH REDUCED INPUT CAPACITANCE

CROSS REFERENCE TO RELATED APPLICATIONS

This application is a continuation of, and thereby claims benefit under 35 U.S.C. § 120 to, U.S. patent application Ser. No. 17/359,257, which is incorporated herein by reference in its entirety.

FIELD

The disclosed technology generally relates to an operational amplifier.

BACKGROUND

Settling time reduction may be one issue with an operational amplifiers. A reduced settling time of the operational amplifier may enhance the operation speed, and therefore an operational amplifier may be designed to reduce the settling time.

SUMMARY

This summary is provided to introduce in a simplified form a selection of concepts that are further described below in the detailed description. This summary is not intended to identify key features or essential features of the claimed subject matter, nor is it intended to limit the scope of the claimed subject matter.

In one or more embodiments, an operational amplifier is provided. The operational amplifier includes a first output transistor having a gate coupled to an output node, at least one first intermediate transistor each having a common gate node, a first input transistor having a gate coupled to an input node, and a first load device coupled to sources of the first output transistor, the at least one first intermediate transistor, and the first input transistor. The operational amplifier further includes an output stage coupled to the output node, configured to drive the voltage on the output node based on a first current through the first output transistor, a second current through the at least one first intermediate transistors, and a third current through the first input transistor. The operational amplifier further includes a first switch coupled between the common gate node of the at least one first intermediate transistor and the gate of the first input transistor, and a second switch coupled between the output node and the common gate node of the at least one first intermediate transistors.

In one or more embodiments, a method to control input capacitance in an amplifier circuit. The method includes generating a first current through a first output transistor having a gate coupled to an output node, generating a second current through the at least one first intermediate transistor each having a common gate node, and generating a third current through an input transistor having a gate coupled to an input voltage, the sources of the first output transistor, the at least one first intermediate transistors and the first input transistor being coupled to a load device. The method further includes driving the output voltage on the output node based on the first current, the second current, and the third current, electrically connecting the common gate node of the at least one first intermediate transistors to the gate of the input transistor during a first period, and electrically connecting the common gate node of the at least one first intermediate transistors to the output node during a second period that follows the first period. The second period begins with a change in the input voltage.

Other aspects of the embodiments will be apparent from the following description and the appended claims.

BRIEF DESCRIPTION OF DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

FIG. 7B illustrates an example operation of the operational amplifier illustrated in FIG. 7A, according to one or more embodiments.

Figure 1:
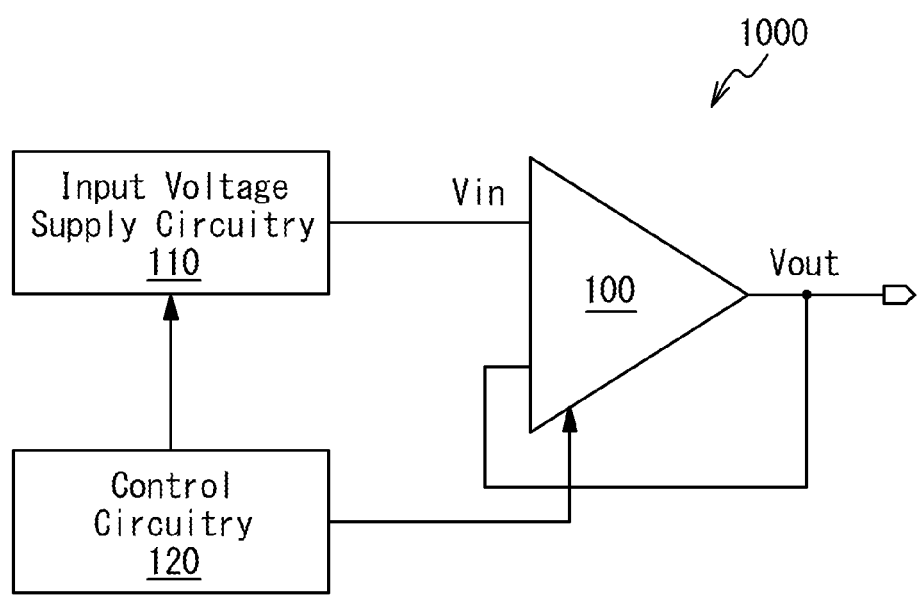
FIG. 1 illustrates an example configuration of a system, according to one or more embodiments.

To facilitate understanding, identical reference numerals have been used, where possible, to designate identical elements that are common to the figures. It is contemplated that elements disclosed in one embodiment may be beneficially utilized in other embodiments without specific recitation. Suffixes may be attached to reference numerals for distinguishing identical elements from each other. The drawings referred to herein should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

In the present application, the term "coupled" means connected directly to or connected through one or more intervening components or circuits.

One issue with operational amplifiers is the settling time, which may be the time required for an output to reach and remain within a given error band after the input is given. Reduction in the settling time may advantageously enhance the operational speed of the system. For example, in embodiments where operational amplifiers are used in a display driver configured to drive a display panel, reduction in the settling time may allow an increased refresh rate.

One approach to reduce the settling time of an operational amplifier is to reduce the input capacitance of the operational amplifier. The reduction in the input capacitance of the operational amplifier may reduce an input current at the input of the operational amplifier and thereby suppress fluctuation in the voltage level of a signal line coupled to the input. The suppression of the voltage level fluctuation may contribute to the reduction in the settling time. The reduction of the input capacitance may be especially advantageous in the case where an increased number of operational amplifiers are commonly coupled to the same signal line that provides the input voltage to the respective operational amplifiers.

The present disclosure provides various approaches to reduce the input capacitance of an operational amplifier. In one embodiment, an operational amplifier includes a first transistor, a second transistor, a third transistor, a constant current source, and an output stage. The first transistor has a first gate configured to receive an output voltage from an output node. The second transistor has a second gate. The third transistor has a third gate configured to receive an input voltage. The constant current source is coupled to sources of the first transistor, the second transistor, and the third transistor. The output stage is configured to drive the output voltage on the output node based on a first current through the first transistor, a second current through the second transistor, and a third current through the third transistor. A first switch is coupled between the second gate of the second transistor and the third gate of the third transistor, and a second switch is coupled between the output node and the second gate of the second transistor. This configuration of the operational amplifier allows selectively connecting and disconnecting the gate of the second transistor to and from the gate of the third transistor, which may reduce the effective input capacitance of the operational amplifier. The first, second, and third transistors may have a first channel conductivity type. In some embodiments, the first channel conductivity type is a positive channel conductivity type. In other embodiments, the first channel conductivity type is a negative channel conductivity type.

In some embodiments, the operational amplifier may further include a fourth transistor, a fifth transistor, a sixth transistor, and a second constant current source. The fourth, fifth, and sixth transistors may have a second channel conductivity type opposite to the first channel conductivity type. In some embodiments, the first channel conductivity type may be a positive channel conductivity type and the second channel conductivity type may be a negative channel conductivity type. In other embodiments, the first conductivity type may be a negative channel conductivity type and the second channel conductivity type may be a positive channel conductivity type. The fourth transistor may have a fourth gate configured to receive the output voltage from the output node. The fifth transistor may have a fifth gate coupled to the second gate of the second transistor. The sixth transistor may have a sixth gate coupled to the third gate of the third transistor to receive the input voltage. The second constant current source may be coupled to sources of the fourth transistor, the fifth transistor, and the sixth transistor. In such embodiments, the output stage may be configured to drive the output voltage based on the first current, the second current, the third current, a fourth current through the fourth transistor, a fifth current through the fifth transistor and a sixth current through the sixth transistor.

FIG. 1 illustrates an example configuration of a system 1000, according to one or more embodiments. In the embodiment illustrated, the system 1000 includes an operational amplifier 100, input voltage supply circuitry 110, and control circuitry 120. The input voltage supply circuitry 110 is configured to supply an input voltage Vin to the operational amplifier 100. In some embodiments, the input voltage Vin may range from 0V to 8V or from 0V to 6V. The operational amplifier 100 is configured as a voltage follower that generates an output voltage Vout in response to the input voltage Vin. In one implementation, the operational amplifier 100 is configured to maintain the output voltage Vout at the same voltage level as the input voltage Vin. In embodiments where the system 1000 is incorporated in a display driver configured to drive a display panel, the operational amplifier 100 may be configured as a source driver configured to drive a source line (which may be also referred as data line) of the display panel by supplying the output voltage Vout to the source line, and the input voltage supply circuitry 110 may include a digital-to-analog converter (DAC) configured to generate the input voltage Vin through digital-to-analog conversion of image data. The control circuitry 120 may be configured to generate control signals to control the operations of the operational amplifier 100 and/or the input voltage supply circuitry 110.

Figure 2:
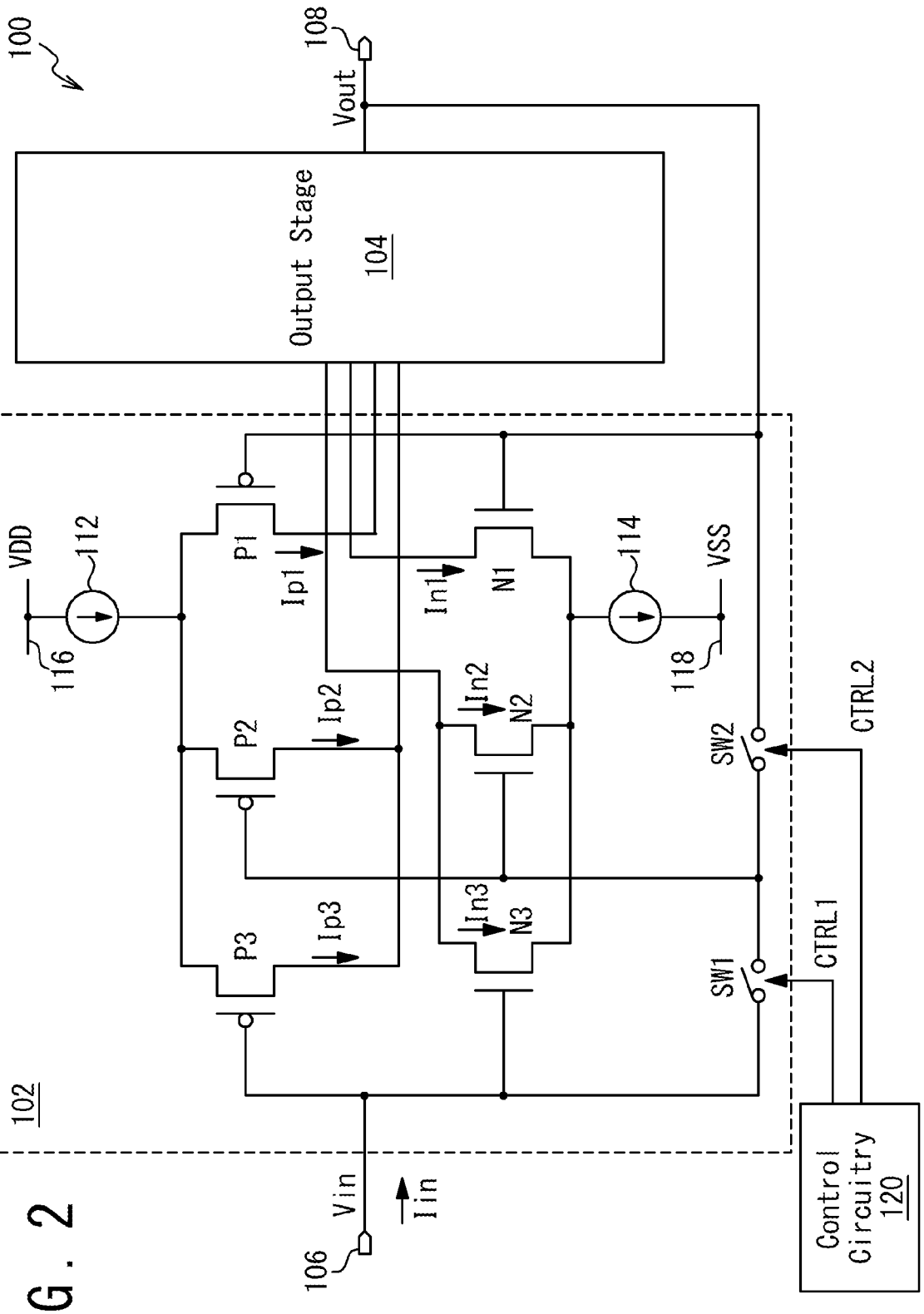
FIG. 2 illustrates an example configuration of an operational amplifier, according to one or more embodiments.

FIG. 2 illustrates an example configuration of the operational amplifier 100, according to one or more embodiments. In the illustrated embodiment, the operational amplifier 100 includes a differential input stage 102 and an output stage 104. The differential input stage 102 is configured to receive the input voltage Vin on an input node 106 and the output stage 104 is configured to output an output voltage Vout from an output node 108 based on inputs received from the differential input stage 102. In the illustrated embodiment, the differential input stage 102 includes positive-channel metal oxide semiconductor (PMOS) transistors P1, P2, and P3, negative-channel metal oxide semiconductor (NMOS) transistors N1, N2, and N3, constant current sources 112, 114, and switches SW1 and SW2. The PMOS transistors P1, P2, and P3 (and other PMOS transistors if any) have a positive channel conductivity type, and the NMOS transistors N1, N2, and N3 (and other NMOS transistors) have a negative channel conductivity type.

Figure 7A:
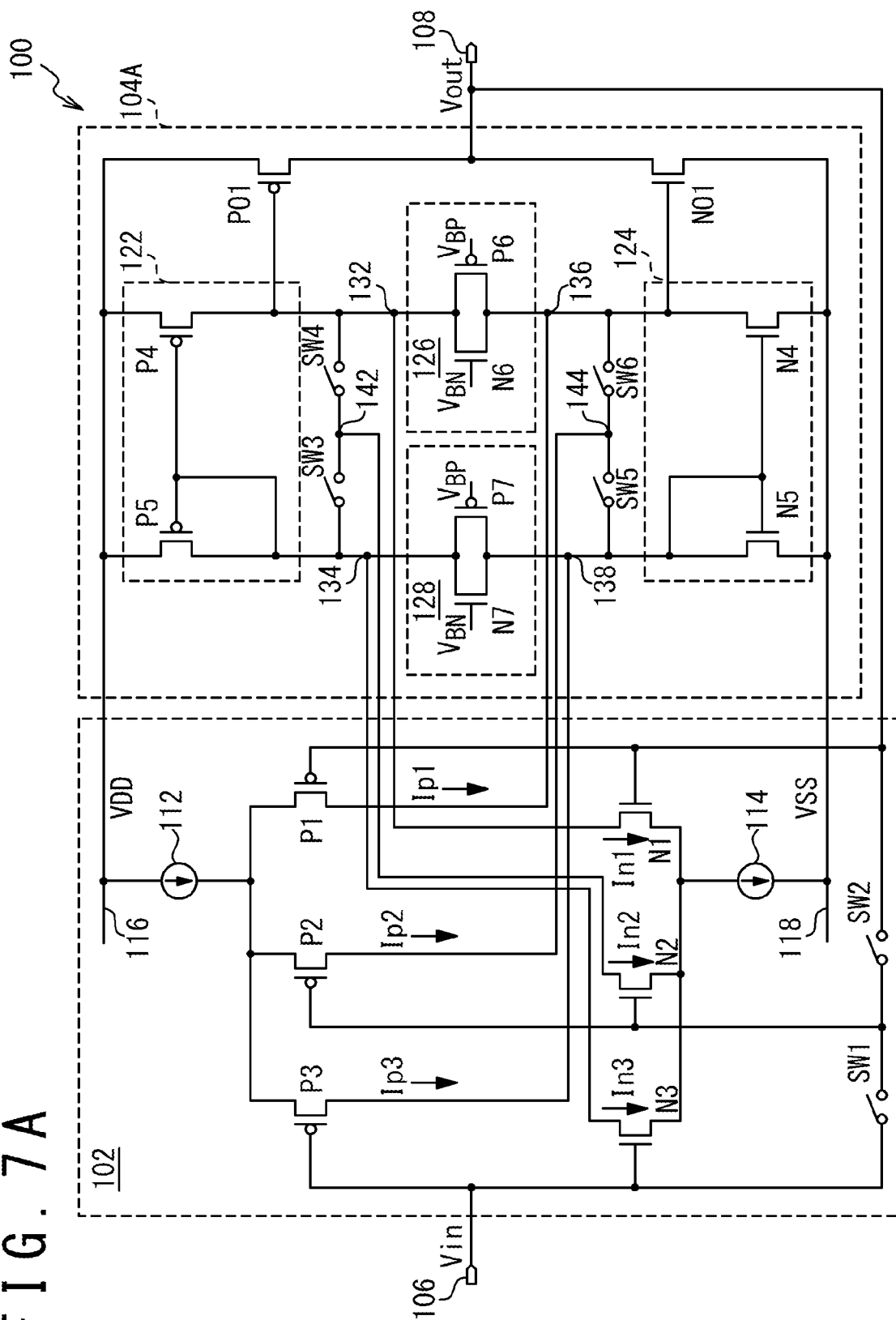
FIG. 7A illustrates an example configuration of an operational amplifier, according to one or more embodiments.

The sources of the PMOS transistors P1, P2, and P3 are commonly coupled to the constant current source 112, and the drains of the PMOS transistors P1, P2, and P3 are coupled to the output stage 104. In the illustrated embodiment, the drains of the PMOS transistors P2 and P3 are commonly coupled, and the commonly coupled drains are coupled to the output stage 104. In other embodiments, the drains of the PMOS transistors P2 and P3 may be individually coupled to the output stage 104 (e.g., as illustrated in FIG. 7A).

The sources of the NMOS transistors N1, N2, and N3 are commonly coupled to the constant current source 114, and the drains of the NMOS transistors N1, N2, and N3 are coupled to the output stage 104. In the illustrated embodiment, the drains of the NMOS transistors N2 and N3 are commonly coupled, and the commonly coupled drains are coupled to the output stage 104. In other embodiments, the drains of the NMOS transistors N2 and N3 may be individually coupled to the output stage 104 (e.g., as illustrated in FIG. 7A).

The constant current source 112 is coupled between a high-side power supply line 116 on which a high-side power supply voltage VDD is generated and the commonly-coupled sources of the PMOS transistors P1, P2, and P3. The constant current source 112 is configured to feed a constant current to the commonly-coupled sources of the PMOS transistors P1, P2, and P3.

The constant current source 114 is coupled between the commonly-coupled sources of the NMOS transistors N1, N2, and N3 and a low-side power supply line 118 on which a low-side power supply voltage VSS lower than the high-side power supply voltage VDD is generated. In one implementation, the low-side power supply voltage VSS is at a circuit ground level and the high-side power supply voltage VDD is at a voltage level higher than the circuit ground level. The constant current source 114 is configured to draw a constant current from the commonly-coupled sources of the NMOS transistors N1, N2, and N3.

The gates of the PMOS transistor P1 and the NMOS transistor N1 are commonly coupled to the output node 108 to receive the output voltage Vout, and the gates of the PMOS transistor P3 and the NMOS transistor N3 are commonly coupled to the input node 106 to receive the input voltage Vin.

The gates of the PMOS transistor P2 and the NMOS transistor N2 are commonly coupled to the switch SW1 and the switch SW2. The switch SW1 is coupled between the input node 106 and the commonly-coupled gates of the PMOS transistor P2 and the NMOS transistor N2, and the switch SW2 is coupled between the output node 108 and the commonly-coupled gates of the PMOS transistor P2 and the NMOS transistor N2. The switch SW1 may be configured to turn on and off in response to a control signal CTRL1 received from the control circuitry 120 and the switch SW2 may be configured to turn on and off in response to a control signal CTRL2 received from the control circuitry 120.

The output stage 104 is configured to generate the output voltage Vout based on the current Ip1 through the PMOS transistor P1, the current Ip2 through the PMOS transistor P2, and the current Ip3 through the PMOS transistor P3. In the illustrated embodiment in which the drains of the PMOS transistors P2 and P3 are commonly coupled, the output stage 104 may be configured to generate the output voltage Vout based on the difference between the current Ip1 and the sum current of the currents Ip2 and Ip3.

The output voltage Vout is generated further based on the current In1 through the NMOS transistor N1, the current In2 through the NMOS transistor N2, and the current In3 through the NMOS transistor N3. In the illustrated embodiment in which the drains of the NMOS transistors N2 and N3 are commonly coupled, the output stage 104 may be configured to generate the output voltage Vout based on the difference between the current In1 and the sum current of the currents In2 and In3.

In one or more embodiments, the operational amplifier 100 has two operation states in which the switches SW1 and SW2 are exclusively turned on. In a first operation state, the switch SW1 is on and the switch SW2 is off. In the first operation state, the gates of the PMOS transistor P2 and the NMOS transistor N2 are electrically connected to the input node 106 (that is, the commonly-coupled gates of the PMOS transistor P3 and the NMOS transistor N3), and are electrically disconnected from the output node 108. In a second operation state, the switch SW1 is off and the switch SW2 is on. In the second operation state, the gates of the PMOS transistor P2 and the NMOS transistor N2 are electrically connected to the output node 108, and are electrically disconnected from the input node 106.

In one or more embodiments, the gate widths of the PMOS transistors P1, P2, and P3 may be adjusted such that the gate width of the PMOS transistor P1 is substantially equal to the sum of the gate widths of the PMOS transistors P2 and P3. The term "substantially equal" in this application is intended to refer to the fact that the variances for the gate widths are within the range of manufacturing tolerances. The thus-adjusted gate widths of the PMOS transistors P1, P2, and P3 effectively reduces the offset of the output voltage Vout of the operational amplifier 100 in the first operation mode, in which the switch SW1 is on and the switch SW2 is off.

In one or more embodiments, the gate widths of the NMOS transistors N1, N2, and N3 may be adjusted such that the gate width of the NMOS transistor N1 is substantially equal to the sum of the gate widths of the NMOS transistors N2 and N3. The thus-adjusted gate widths of the NMOS transistors N1, N2, and N3 may reduce the offset of the output voltage Vout in the first operation mode.

In one or more embodiments, the gate widths of the PMOS transistors P2 and P3 may be adjusted such that the gate width of the PMOS transistor P2 is larger than the gate width of the PMOS transistor P3. The thus-adjusted gate widths of the PMOS transistors P2 and P3 effectively reduce the input capacitance of the operational amplifier 100 in the second operation mode, in which the switch SW1 is off and the switch SW2 is on.

In one or more embodiments, the gate widths of the NMOS transistors N2 and N3 may be adjusted such that the gate width of the NMOS transistor N2 is larger than the gate width of the NMOS transistor N3. The thus-adjusted gate widths of the NMOS transistors N2 and N3 effectively reduce the input capacitance of the operational amplifier 100 in the second operation mode. A description is given below of the reduction in the input capacitance in the second operation mode with reference to FIG. 3 and FIG. 4

Figure 3:
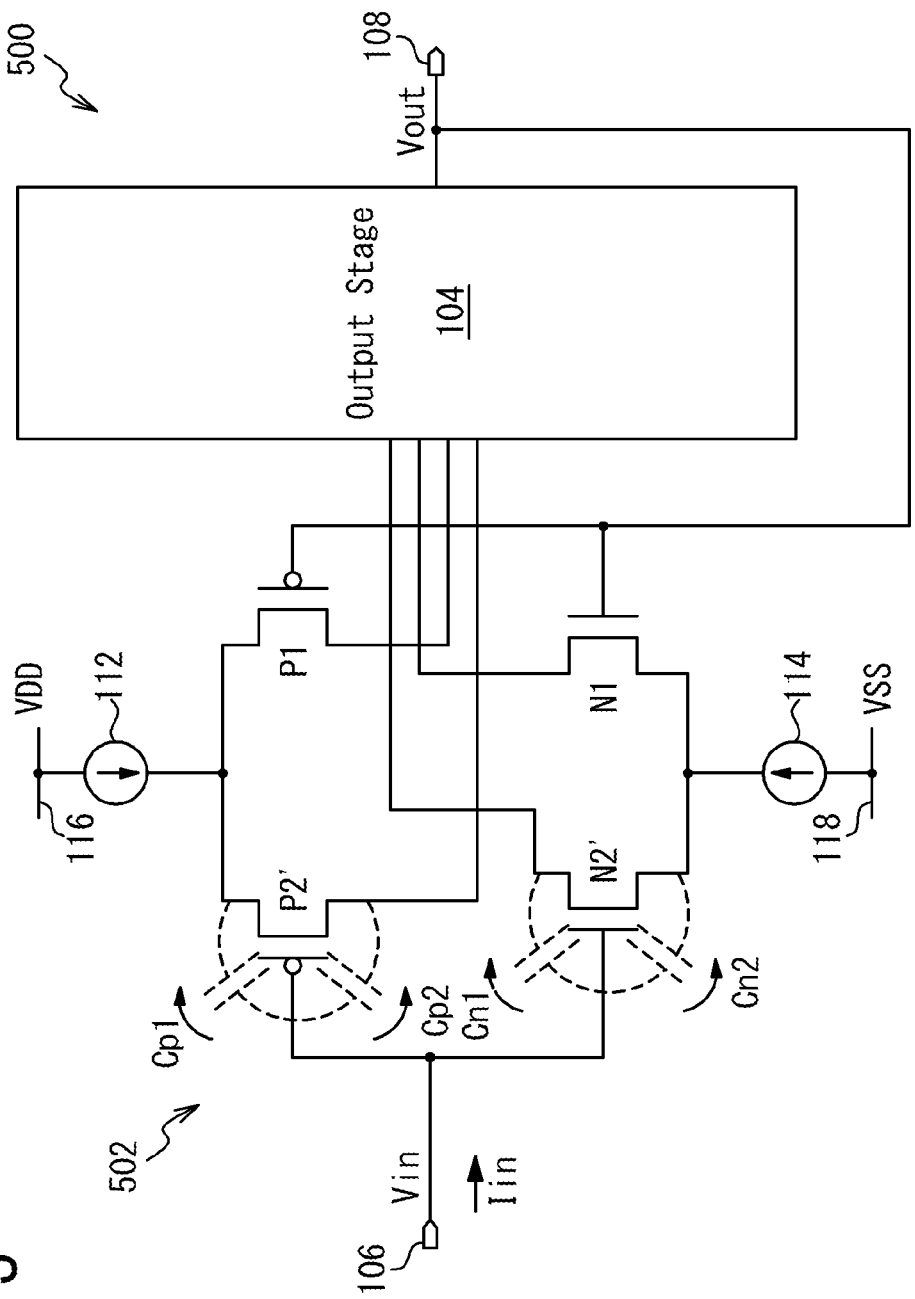
FIG. 3 illustrates an example input capacitance of a typical operational amplifier.

FIG. 3 illustrates an example input capacitance of a comparative example operational amplifier 500 with a differential input stage 502 that includes a pair of PMOS transistors P1 and P2' and a pair of NMOS transistors N1 and N2'. It is noted that, to avoid an offset of the output voltage Vout, the operational amplifier 500 of FIG. 3 is designed such that the PMOS transistors P1 and P2' have the same gate width (or the same transistor size) and the NMOS transistors N1 and N2' have the same gate width. The input capacitance of the operational amplifier 500 of FIG. 3 is the sum of Cp1, Cp2, Cn1, and Cn2, where Cp1 is the gate-source capacitance of the PMOS transistor P1, the Cp2 is the gate-drain capacitance of the PMOS transistor P1, Cn1 is the gate-source capacitance of the NMOS transistor N1, and Cn2 is the gate-drain capacitance of the NMOS transistor N1.

Figure 4:
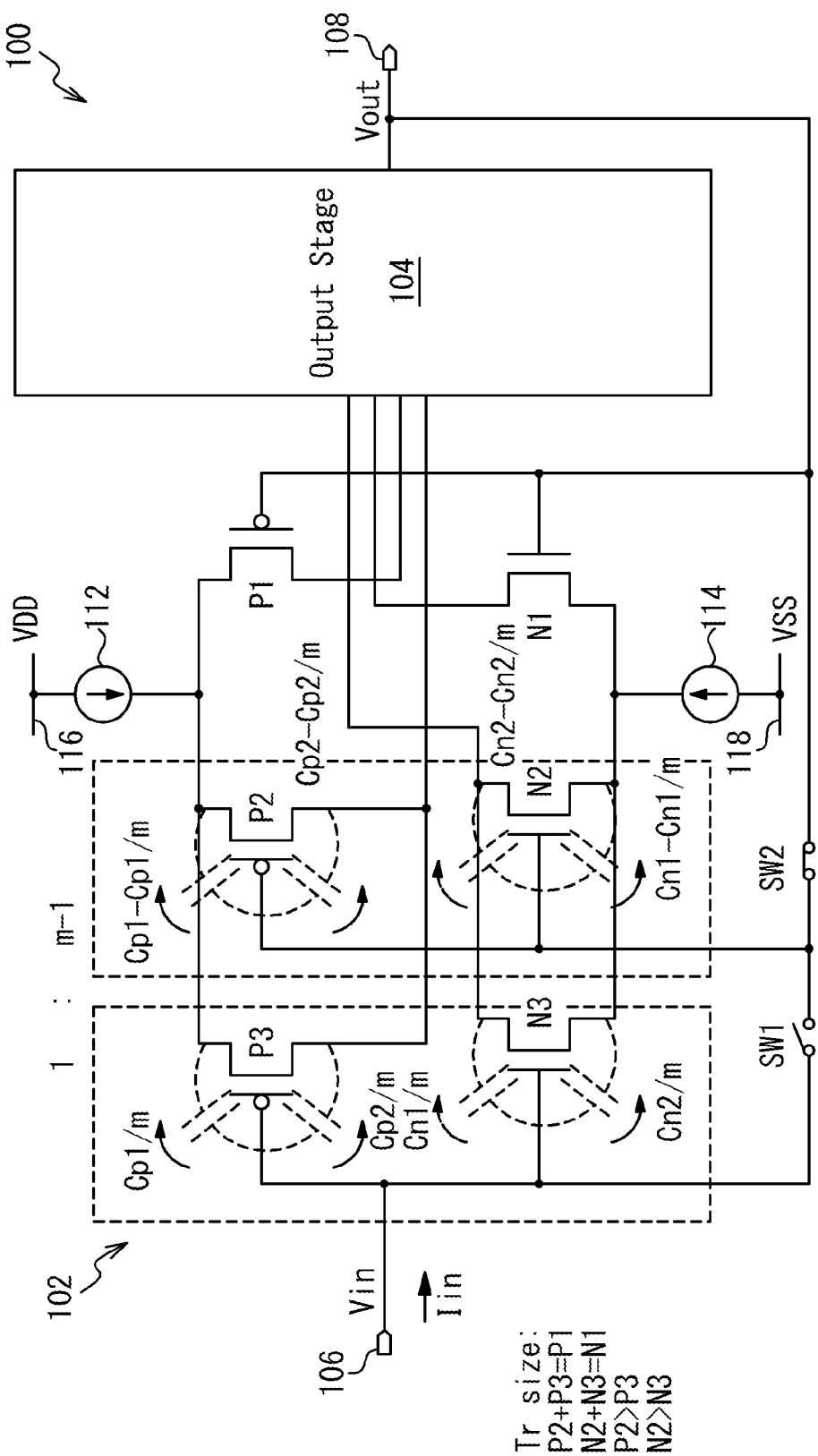
FIG. 4 illustrates an example input capacitance of the operational amplifier illustrated in FIG. 2, according to one or more embodiments.

FIG. 4 illustrates an example input capacitance of the operational amplifier 100 illustrated in FIG. 2 in the second operation state in which the SW1 is off and the switch SW2 is on, according to one or more embodiments. In one or more embodiments, the operational amplifier 100 of FIG. 2 is configured to reduce the input capacitance by placing the operational amplifier 100 into the second operation state. In the illustrated embodiment, the gate width of the PMOS transistor P2 is 1/m times of the gate width of the PMOS transistor P1; the gate width of the PMOS transistor P3 is (1-1/m) times of that of the PMOS transistor P1; the gate width of the NMOS transistor N2 is 1/m times of that of the NMOS transistor N1; and the gate width of the NMOS transistor N3 is (1-1/m) times of that of the NMOS transistor N1, where m is the ratio of the gate width of the PMOS transistor P1 to the gate width of the PMOS transistor P2 and larger than 1. In this case, the sum of the gate widths of the PMOS transistors P2 and P3 is equal to the gate width of the PMOS transistor P1, and the sum of the gate widths of the NMOS transistors N2 and N3 is equal to the gate width of the NMOS transistor N1. It is noted that the operational amplifier 100 in the illustrated embodiment is configured to operate in the same manner as the comparative example operational amplifier 500 of FIG. 3 when the operational amplifier 100 is in the first operation state. In the illustrated embodiment, the input capacitance of the operational amplifier 100 is reduced to 1/m times of that of the operational amplifier 500 by placing the operational amplifier 100 into the second operation state.

Figure 5:
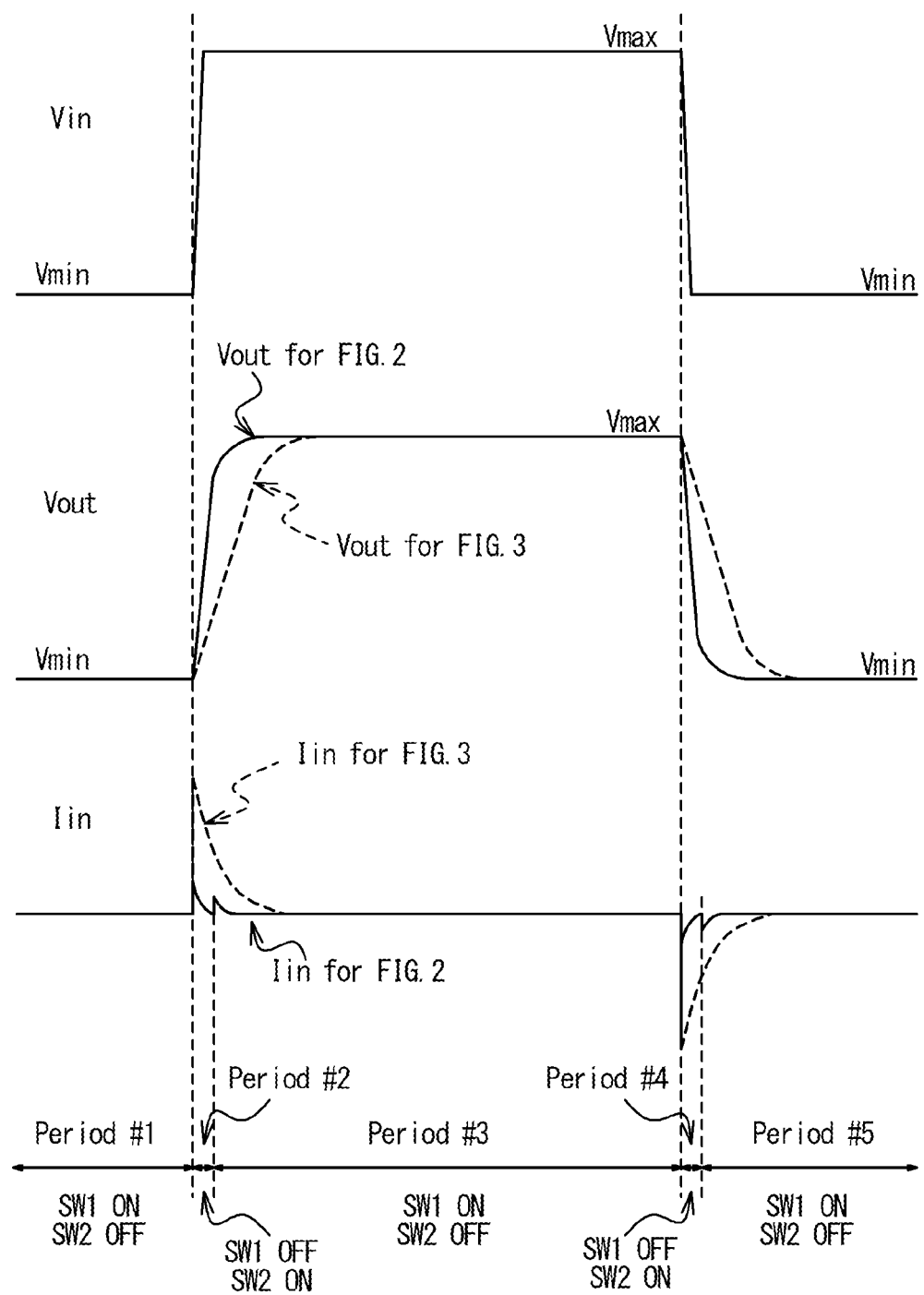
FIG. 5 illustrates an example operation of the operational amplifier illustrated in FIG. 2, according to one or more embodiments.

FIG. 5 illustrates an example operation of the operational amplifier 100 illustrated in FIG. 2, according to one or more embodiments. In the illustrated embodiment, the operation of the operational amplifier 100 begins with period #1 during which the operational amplifier 100 is initially in the first operation state in which the switch SW1 is on and the switch SW2 is off. During period #1, the switch SW1 electrically connects the gates of the PMOS transistor P2 and the NMOS transistor N2 to the gates of the PMOS transistor P3 and the NMOS transistor N3, while the switch SW2 electrically disconnects the gates of the PMOS transistor P2 and the NMOS transistor N2 from the output node 108. As a result, the output voltage Vout is coincident with the input voltage Vin during period #1. In the illustrated embodiment, the input voltage Vin and the output voltage Vout are both kept at a first voltage Vmin during period #1. The first voltage Vmin may be the minimum voltage the operational amplifier 100 is configured to output.

Period #2 that follows period #1 begins with a change in the input voltage Vin to a second voltage Vmax higher than the first voltage Vmin. The second voltage Vmax may be the maximum voltage the operational amplifier 100 is configured to output. In one implementation, the input voltage supply circuitry 110 (illustrated in FIG. 1) is configured to pull up the input voltage Vin to the second voltage Vmax at the beginning of period #2, and the control circuitry 120 (illustrated in FIG. 1) is configured to detect the start of period #2 and switch the operational amplifier 100 to the second operation state at the beginning of period #2.

During period #2, the operational amplifier 100 is placed into the second operation state in which the switch SW1 is off and the switch SW2 is on. During period #2, the switch SW1 electrically disconnects the gates of the PMOS transistor P2 and the NMOS transistor N2 from the gates of the PMOS transistor P3 and the NMOS transistor N3, while the switch SW2 electrically connects the gates of the PMOS transistor P2 and the NMOS transistor N2 to the output node 108. The operational amplifier 100 is kept in the second operation state during period #2.

As is described in relation to FIG. 3 and FIG. 4, placing the operational amplifier 100 in the second operation state, in which the switch SW1 is off and the switch SW2 is on, effectively reduces the input capacitance of the operational amplifier 100 and thereby reduces the input current Iin. In FIG. 5, the solid line for Iin indicates an example waveform of the input current of the operational amplifier 100 of FIG. 2, and the broken line for Iin indicates an example waveform of the input current of the comparative example operational amplifier 500 of FIG. 3. The reduction in the input capacitance of the operational amplifier 100 allows promptly pulling the input voltage Vin up to the second voltage Vmax, which contributes settling time reduction.

The output voltage Vout is pulled up towards the second voltage Vmax in response to the input voltage Vin being changed to the second voltage Vmax. It is noted that, although the gates of the PMOS transistor P2 and the NMOS transistor N2 are electrically disconnected from the input node 106, the voltages on the gates of the PMOS transistor P2 and the NMOS transistor N2 also approach the second voltage Vmax during period #2 as the gates of the PMOS transistor P2 and the NMOS transistor N2 are charged with the output voltage Vout. Charging the gates of the PMOS transistor P2 and the NMOS transistor N2 with the output voltage Vout also helps reduction in the input current Iin. During period #2, the output voltage Vout may not reach the second voltage Vmax due to the load capacitance coupled to the output node 108 and/or an offset potentially caused by electrically connecting the gates of the PMOS transistor P2 and the NMOS transistor N2 to the gates of the PMOS transistor P1 and the NMOS transistor N1, which may cause an unbalance of the differential input stage 102.

During period #3 that follows period #2, the operational amplifier 100 is returned to the first operation state in which the switch SW1 is on and the switch SW2 is off. During period #3, the switch SW1 electrically connects the gates of the PMOS transistor P2 and the NMOS transistor N2 to the gates of the PMOS transistor P3 and the NMOS transistor N3, while the switch SW2 electrically disconnects the gates of the PMOS transistor P2 and the NMOS transistor N2 from the output node 108. The input voltage Vin is kept at the second voltage Vmax during period #3, and the output voltage Vout reaches the second voltage Vmax in the initial phase of period #3. It is noted that the differential input stage 102 recovers from the unbalance during period #3 by electrically connecting the gates of the PMOS transistor P2 and the NMOS transistor N2 to the gates of the PMOS transistor P3 and the NMOS transistor N3.

Period #4 that follows period #3 begins with a change in the input voltage Vin to the first voltage Vmin. During period #4, the operational amplifier 100 is placed into the second operation state in which the switch SW1 is off and the switch SW2 is on. In one implementation, the input voltage supply circuitry 110 (illustrated in FIG. 1) is configured to pull down the input voltage Vin to the first voltage Vmin at the beginning of period #4, and the control circuitry 120 (illustrated in FIG. 1) is configured to detect the start of period #4 and switch the operational amplifier 100 to the second operation state at the beginning of period #4. The operational amplifier 100 is kept in the second operation state during period #4. As discussed above, placing the operational amplifier 100 in the second operation state effectively reduces the input capacitance of the operational amplifier 100. The reduction in the input capacitance allows promptly pulling the input voltage Vin down to the first voltage Vmin, effectively reducing the settling time.

The output voltage Vout is pulled down towards the first voltage Vmin in response to the input voltage Vin being changed to the first voltage Vmin. During period #4, the output voltage Vout may not reach the first voltage Vmin due to the load capacitance coupled to the output node 108 and/or an offset potentially caused by electrically connecting the gates of the PMOS transistor P2 and the NMOS transistor N2 to the gates of the PMOS transistor P1 and the NMOS transistor N1, which may cause an unbalance of the differential input stage 102.

During period #5 that follows period #4, the operational amplifier 100 is returned to the first operation state in which the switch SW1 is on and the switch SW2 is off. The input voltage Vin is kept at Vmin during period #5, and the output voltage Vout reaches the first voltage Vmin in the initial phase of period #5.

Figure 6:
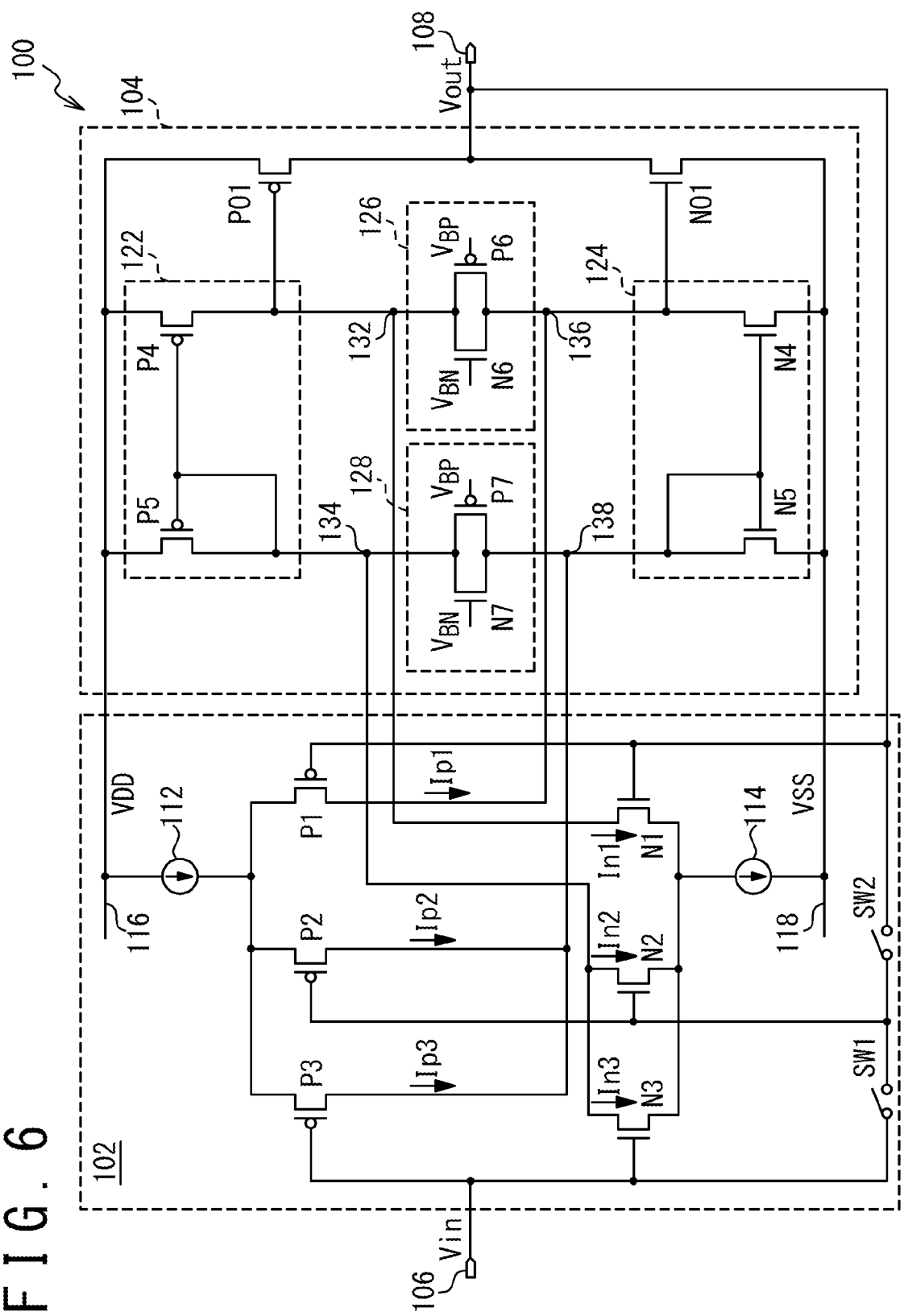
FIG. 6 illustrates an example configuration of an output stage disposed in the operational amplifier of FIG. 2, according to one or more embodiments.

FIG. 6 illustrates an example configuration of the output stage 104 of the operational amplifier 100 of FIG. 2, according to one or more embodiments. In the illustrated embodiment, the output stage 104 is configured to generate the output voltage Vout based on the difference between the current Ip1 and the sum current of the currents Ip2 and Ip3 and the difference between the current In1 and the sum current of the currents In2 and In3. More specifically, the output stage 104 includes current mirrors 122, 124, floating current sources 126, 128, a PMOS output transistor PO1, and an NMOS output transistor NO1.

The current mirror 122 includes PMOS transistors P4 and P5 that have commonly-coupled gates coupled to the drain of the PMOS transistor P5. The sources of the PMOS transistors P4 and P5 are commonly coupled to the high-side power supply line 116. The drain of the PMOS transistor P4 is coupled to a node 132 that is coupled to the drain of the NMOS transistor N1, and the drain of the PMOS transistor P5 is coupled to a node 134 that is coupled to the drains of the NMOS transistors N2 and N3.

The current mirror 124 includes NMOS transistors N4 and N5 that have commonly-coupled gates coupled to the drain of the NMOS transistor N5. The sources of the NMOS transistors N4 and N5 are commonly coupled to the low-side power supply line 118. The drain of the NMOS transistors N4 is coupled to a node 136 that is coupled to the drain of the PMOS transistor P1, and the drain of the NMOS transistor N5 is coupled to a node 138 that is coupled to the drains of the NMOS transistors P2 and P3.

The floating current source 126 is configured to draw a first constant current from the node 132 and supply the first constant current to the node 136. In one implementation, the floating current source 126 includes an NMOS transistor N6 and a PMOS transistor P6. The NMOS transistor N6 has a drain coupled to the node 132, a source coupled to the node 136, and a gate biased with a fixed bias voltage $V_{BN}$. The PMOS transistor P6 has a source coupled to the node 132, a drain coupled to the node 136, and a gate biased with a fixed bias voltage $V_{BP}$.

The floating current source 128 is configured to draw a second constant current from the node 134 and supply the second constant current to the node 138. In one implementation, the floating current source 128 includes an NMOS transistor N7 and a PMOS transistor P7. The NMOS transistor N7 has a drain coupled to the node 134, a source coupled to the node 138, and a gate biased with the fixed bias voltage $V_{BN}$. The PMOS transistor P7 has a source coupled to the node 134, a drain coupled to the node 138, and a gate biased with the fixed bias voltage $V_{BP}$.

The PMOS output transistor PO1 is configured to pull up the output node 108 based on the voltage level on the node 132. The PMOS output transistor PO1 has a gate coupled to the node 132, a source coupled to the high-side power supply line 116, and a drain coupled to the output node 108. Correspondingly, the NMOS output transistor NO1 is configured to pull down the output node 108 based on the voltage level on the node 136. The NMOS output transistor NO1 has a gate coupled to the node 136, a source coupled to the low-side power supply line 118, and a drain coupled to the output node 108.

FIG. 7A illustrates another example configuration of the operational amplifier 100, according to one or more embodiments. In the illustrated embodiment, switches SW3, SW4, SW5, and SW6 are added to the output stage, which is denoted by numeral 104A. The switch SW3 is coupled between the node 134 and an intervening node 142, and the switch SW4 is coupled between the node 132 and the intervening node 142. The switch SW5 is coupled between the node 138 and an intervening node 144, and the switch SW6 is coupled between the node 136 and the intervening node 144. In the embodiment illustrated in FIG. 7A, the drain of the PMOS transistor P2 is coupled to the intervening node 144, and the drain of the NMOS transistor N2 is coupled to the intervening node 142.

FIG. 7B illustrates an example operation of the operational amplifier 100 illustrated in FIG. 7A, according to one or more embodiments. The switches SW3 and SW5 are configured to turn on and off in synchronization with the turn-on-and-off of the switch SW1, and the switches SW4 and SW6 are configured to turn on in synchronization with the switch SW2. More specifically, during periods #1, #3, and #5 of FIG. 5, the switches SW1, SW3, and SW5 are turn on while the switches SW2, SW4, and SW6 turn off. During periods #2 and #4 of FIG. 5, the switches SW1, SW3, and SW5 are turn off while the switches SW2, SW4, and SW6 turn on. The operation illustrated in FIG. 7B causes the voltage levels on the nodes 132 and 136 to be associated with the output voltage Vout more precisely than the operation of the operational amplifier 100 of FIG. 2, which helps driving the output voltage Vout closer towards the voltage level of the input voltage Vin during periods #2 and #4.

Figure 8:
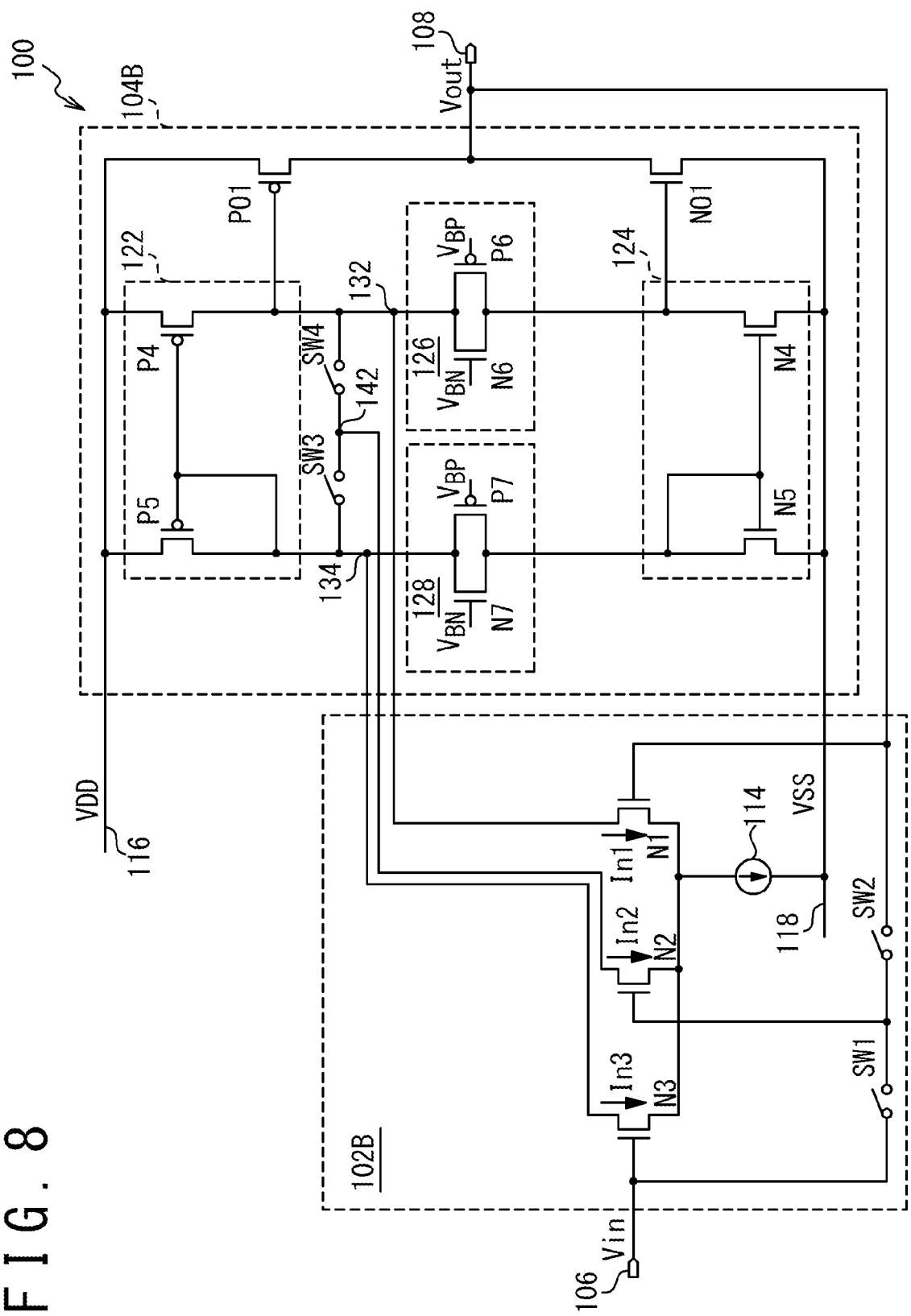
FIG. 8 illustrates an example configuration of an operational amplifier, according to one or more embodiments.

FIG. 8 illustrates still another example configuration of the operational amplifier 100, according to one or more embodiments. The operational amplifier 100 illustrated in FIG. 8 is configured similarly to that illustrated in FIG. 7A, except for that the PMOS transistors P1, P2, P3, and the constant current source 112 are removed from the differential input stage, denoted by numeral 102B, and switches SW5 and SW6 are removed from the output stage, denoted by numeral 104B. The operational amplifier 100 illustrated in FIG. 8 is configured to operate similarly to that illustrated in FIG. 7A, effectively reducing the input capacitance.

Figure 9:
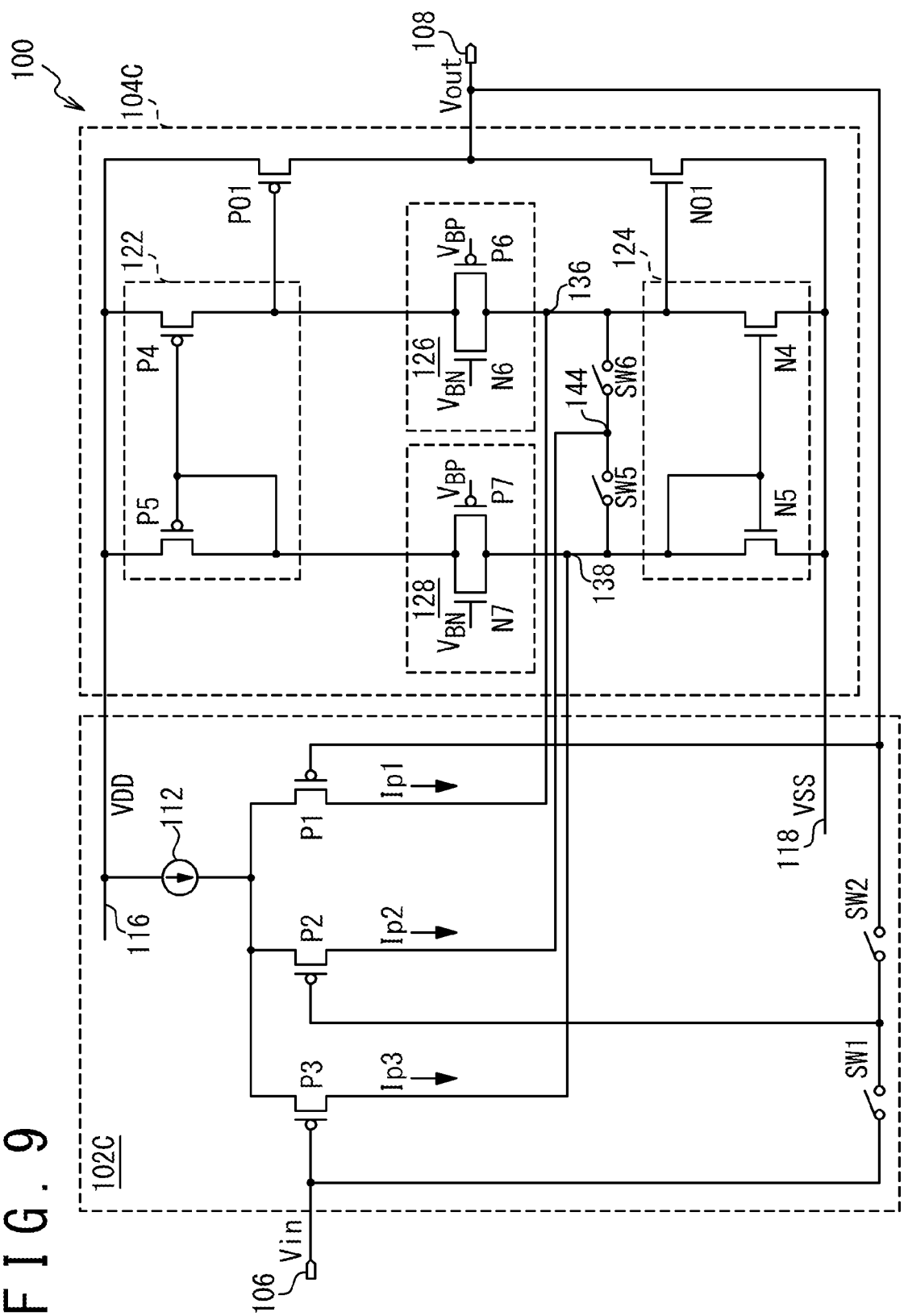
FIG. 9 illustrates an example configuration of an operational amplifier, according to one or more embodiments.

FIG. 9 illustrates still another example configuration of the operational amplifier 100, according to one or more embodiments. The operational amplifier 100 illustrated in FIG. 9 is configured similarly to that illustrated in FIG. 7A, except for that the NMOS transistors N1, N2, N3, and the constant current source 114 are removed from the differential input stage, denoted by numeral 102C, and switches SW3 and SW4 are removed from the output stage, denoted by numeral 104C. The operational amplifier 100 illustrated in FIG. 9 is also configured to operate similarly to that illustrated in FIG. 7A, effectively reducing the input capacitance.

Figure 10:
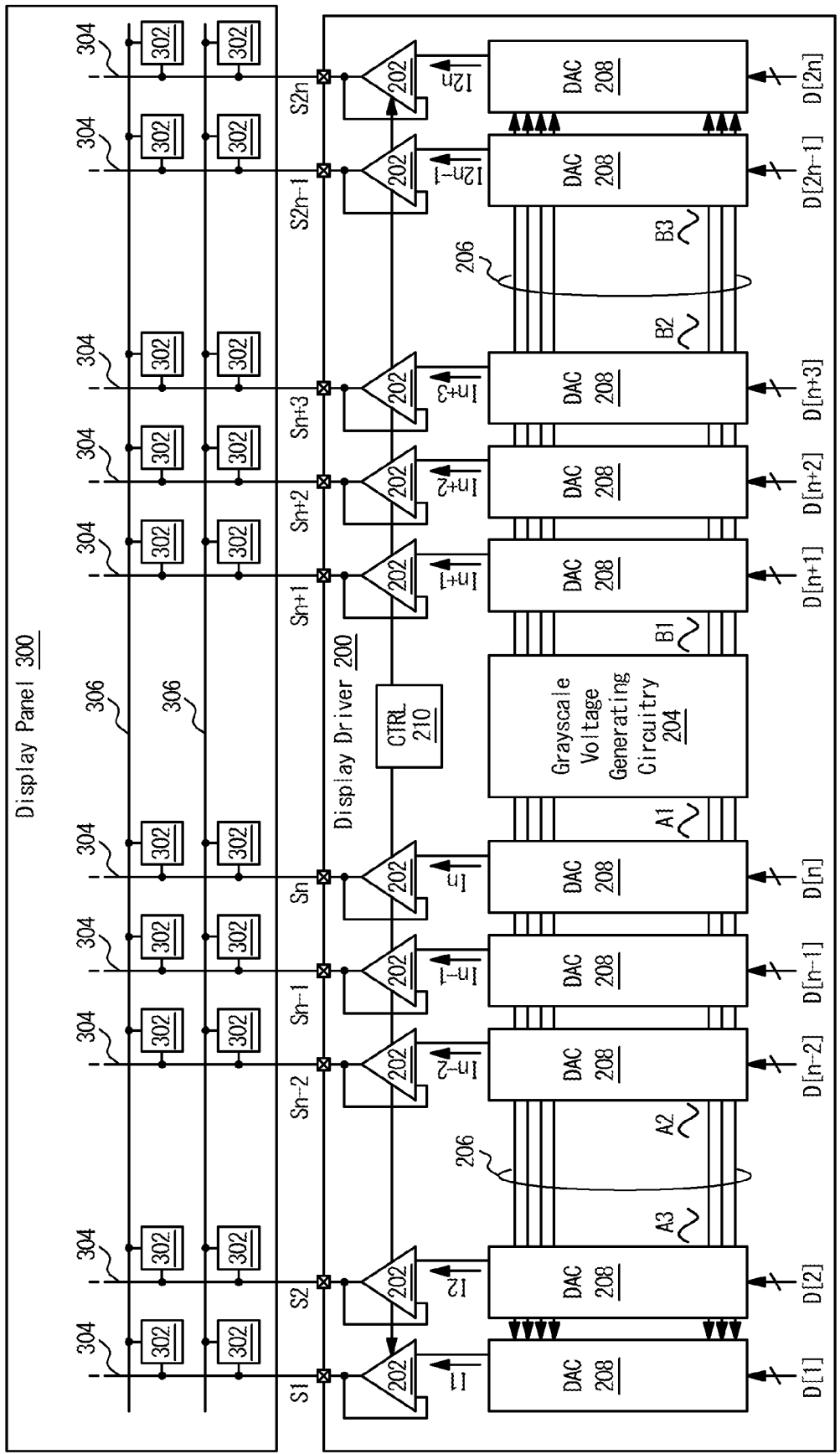
FIG. 10 illustrates an example configuration of a display driver, according to one or more embodiments.

In one or more embodiments, the operational amplifiers illustrated in FIGS. 2, 6, 7A, 8, and 9 may be used as source amplifiers integrated in a display driver configured to drive source lines (also referred to as data lines) of a display panel. FIG. 10 illustrates an example configuration of a display driver 200 thus configured, according to one or more embodiments. In the illustrated embodiment, the display driver 200 is configured to drive a display panel 300 that includes an array of pixels 302, source lines 304, and gate lines (also referred to as scan lines) 306. The display panel 300 may be an organic light emitting diode (OLED) display panel, a liquid crystal display (LCD) panel, or other types of display panels. In embodiments where the display panel 300 is an organic light emitting diode (OLED) display panel, the pixels 302 may each include one or more select transistors, a drive transistor, a hold capacitor, and an OLED. In embodiments where the display panel is an LCD panel, the pixels 302 may include a select transistor, a pixel electrode, and a hold capacitor, where liquid crystal material may be filled between the pixel electrodes of the respective pixels 302 and one or more common electrodes. The display panel 300 may include additional signal lines and/or circuitry depending on the configuration of the pixels 302.

In one or more embodiments, the display driver 200 may include an array of source amplifiers 202, grayscale voltage generating circuitry 204, a set of grayscale voltage lines 206, an array of digital-to-analog converters (DACs) 208, control circuitry 210, and source outputs S1 to S2n, where n is a natural number. The source amplifiers 202 are configured as operational amplifiers configured to supply output voltages to the source lines 304 of the display panel 300 coupled to the source outputs S1 to S2n. The grayscale voltage generating circuitry 204 is configured to generate a set of different grayscale voltages on the grayscale voltage lines 206. The grayscale voltage lines 206 are extended across the array of the DACs 208 to deliver the grayscale voltages to the DACs 208. The DACs 208 are coupled to the source amplifiers 202, respectively. The DACs 208 are configured to receive pixel data, denoted by D[1] to D[2n], respectively. Pixel data D[i] may include a graylevel defined for a corresponding pixel 302 coupled to the source line 304 coupled to the source output Si, where i is a natural number between 1 and 2n, inclusive. The graylevel may correspond to a specified luminance level of the corresponding pixel 302. The DAC 208 that receives the pixel data D[i] is configured to generate an input voltage of the source amplifier 202 coupled to the source output Si. In one implementation, the DAC 208 that receives the pixel data D[i] is configured to select one of the grayscale voltages generated on the grayscale voltage lines 206 and supply the selected grayscale voltage as the input voltage to the input of the source amplifier 202 coupled to the source output Si. In one implementation, the DAC 208 that receives the pixel data D[i] is configured to electrically connect the input of the corresponding source amplifier 202 to the grayscale voltage line 206 on which the selected grayscale voltage is generated and thereby supply the selected grayscale voltage to the input of the corresponding source amplifier 202. The source amplifiers 202 are configured to update the pixels 302 coupled to the corresponding source outputs S1 to S2n with the output voltages output therefrom. The control circuitry 210 is configured to control the source amplifiers 202.

One issue of the display driver 200 may be that, in embodiments where an increased number of source amplifiers 202 (e.g., 1000 or more source amplifiers 202) are integrated in the display driver 200, the input currents (indicated by "I1" to "I2n" in FIG. 10) of the source amplifiers 202 may cause unignorable fluctuations of the grayscale voltages on the grayscale voltage lines 206 (indicated by "A1", "A2", "A3", "B1", "B2", and "B3" in FIG. 10). The fluctuations of the grayscale voltages may cause delays until the input voltages of the source amplifiers 202 reach specified voltage levels, undesirably increasing the settling times of the source amplifiers 202.

To mitigate or eliminate the effect of the input currents of the source amplifiers 202, in one or more embodiments, the operational amplifiers 100 illustrates in FIGS. 2, 6, 7A, 8, and 9 are used as the source amplifiers 202 in the display driver 200. The use of the operational amplifiers 100 illustrates in FIGS. 2, 6, 7A, 8, and 9, which have reduced input capacitances as discussed above, effectively reduces the input currents on the inputs of the source amplifiers 202, suppressing or eliminating the fluctuations of the grayscale voltages on the grayscale voltage lines 206. Accordingly, the use of the operational amplifiers 100 illustrates in FIGS. 2, 6, 7A, 8, and 9 for the source amplifiers 202 effectively reduces the settling times of the source amplifiers 202. In embodiments where the operational amplifiers 100 illustrated in FIGS. 2 and 6 are used as the source amplifiers 202, the control circuitry 210 may be configured to control the switches SW1 and SW2. In embodiments where the operational amplifiers 100 illustrated in FIGS. 7A, 8, and 9 are used as the source amplifiers 202, the control circuitry 210 may be configured to control the switches SW1 to SW6.

Figure 11:
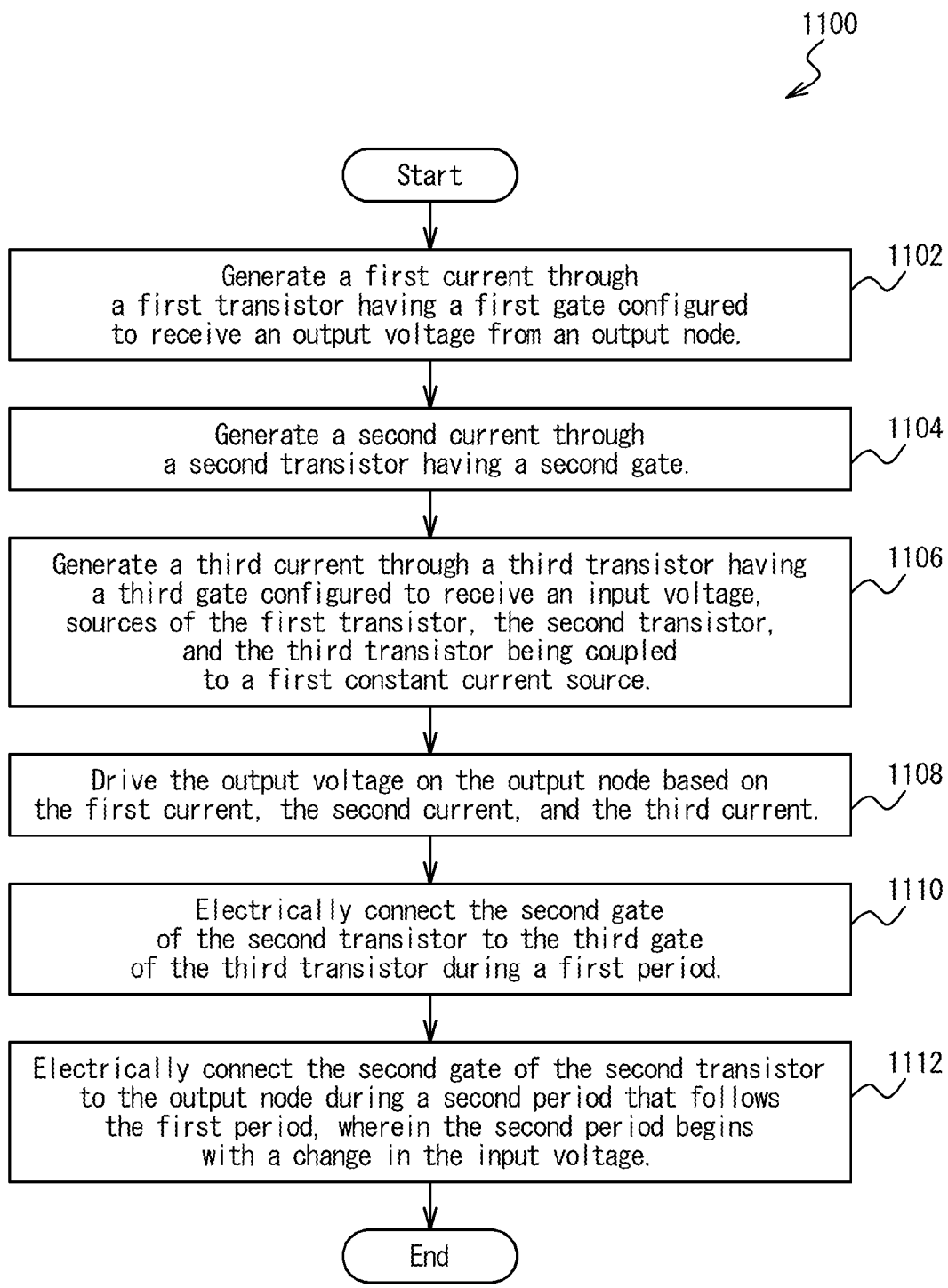
FIG. 11 illustrates an example method of operating an operational amplifier, according to one or more embodiments.

Method 1100 of FIG. 11 illustrates steps for operating an operational amplifier (e.g., the operational amplifiers 100 illustrated in FIGS. 2, 6, 7A, 8, and 9). It is noted that one or more of the steps illustrated in FIG. 11 may be omitted, repeated, and/or performed in a different order than the order illustrated in FIG. 11. It is further noted that two or more steps may be implemented at the same time.

The method includes generating a first current through a first transistor (e.g., the PMOS transistors P1 and the NMOS transistor N1 illustrated in FIGS. 2, 6, 7A, 8, and 9) at step 1102. The first transistor has a first gate configured to receive an output voltage (e.g., the output voltage Vout) from an output node (e.g., the output node 108.) The method further includes generating a second current through a second transistor (e.g., the PMOS transistor P2 and the NMOS transistor N2) at step 1104. The second transistor has a second gate. The method further includes generating a third current through a third transistor (e.g., the PMOS transistor P3 and the NMOS transistor N3) at step 1106. The third transistor has a third gate configured to receive an input voltage (e.g., the input voltage Vin). The sources of the first transistor, the second transistor, and the third transistor are coupled to a first constant current source (e.g., the constant current sources 112 and 114.)

The method further includes driving the output voltage on the output node based on the first current, the second current, and the third current at step 1108. The method further includes electrically connecting the second gate of the second transistor to the third gate of the third transistor during a first period (e.g., period #1 in FIG. 5) at step 1110, and electrically connecting the second gate of the second transistor to the output node during a second period (e.g., period #2 in FIG. 5) that follows the first period at step 1112. The second period begins with a change in the input voltage.

While many embodiments have been described, those skilled in the art, having benefit of this disclosure, will appreciate that other embodiments can be devised which do not depart from the scope. Accordingly, the scope of the invention should be limited only by the attached claims.

What is claimed is:

1. An operational amplifier, comprising:
   a first output transistor having a gate coupled to an output node;
   at least one first intermediate transistor each having a common gate node;
   a first input transistor having a gate coupled to an input node;
   a first load device coupled to sources of the first output transistor, the at least one first intermediate transistor, and the first input transistor;

an output stage coupled to the output node, configured to drive the voltage on the output node based on a first current through the first output transistor, a second current through the at least one first intermediate transistors, and a third current through the first input transistor;

a first switch coupled between the common gate node of the at least one first intermediate transistor and the gate of the first input transistor; and a second switch coupled between the output node and the common gate node of the at least one first intermediate transistors.

2. The operational amplifier of claim 1, wherein a gate width of the first output transistor is substantially equal to a sum of the gate widths of the at least one first intermediate transistor and a gate width of the first input transistor.

3. The operational amplifier of claim 1, wherein the sum of the gate widths of the at least one first intermediate transistor is larger than a gate width of the first input transistor.

4. The operational amplifier of claim 1, wherein the first switch is configured to:

electrically connect the common gate node of the at least one first intermediate transistor to the gate of the first input transistor during a first period; and electrically disconnect the common gate node of the at least one intermediate transistor from the gate of the first input transistor during a second period that follows the first period, and wherein the second period begins with a change in the input voltage.

5. The operational amplifier of claim 4, wherein the second switch is configured to:

electrically disconnect the common gate of the at least one first intermediate transistor from the output node during the first period; and electrically connect the common gate of the at least one first intermediate transistor to the output node during the second period.

6. The operational amplifier of claim 5, wherein the first switch is configured to electrically connect the common gate of the at least one first intermediate transistor to the gate of the first input transistor during a third period that follows the second period, the input voltage being kept constant during the third period, and wherein the second switch is configured to electrically disconnect the common gate of the at least one first intermediate transistor from the output node during the third period.

7. The operational amplifier of claim 1, wherein the first output transistor, the at least one first intermediate transistor, and the input transistor have a first channel conductivity type.

8. The operational amplifier of claim 7, further comprising:

a second output transistor having a gate coupled to an output node, the second output transistor has a second channel conductivity type opposite to the first channel conductivity type;

at least one second intermediate transistor having a gate coupled to the common gate of the at least one first intermediate transistor;

a second input transistor having a gate coupled to the gate of the first input transistor and configured to receive the input voltage; and a second load device coupled to the sources of the second output transistor, the at least one second intermediate transistor, and the second input transistor;

wherein the output stage coupled to the output node, configured to drive the voltage on the output node based on a first current through the first output transistor, a second current through the at least on first intermediate transistor, a third current through the first input transistor, a fourth current through the second output transistor, a fifth current through the at least one second intermediate transistors, and a sixth current through the second input transistor.

9. The operational amplifier of claim 8, wherein a gate width of the second output transistor is substantially equal to a sum of a gate widths of the at least one second intermediate transistor and a gate width of the second input transistor.

10. The operational amplifier of claim 8, wherein the sum of the gate widths of the at least one second intermediate transistor is larger than a gate width of the second input transistor.

11. The operational amplifier of claim 8, wherein the first switch is configured to:

electrically connect the common gate of the at least one first intermediate transistor and the common gate of the at least one second intermediate transistor to the gate of the first input transistor and the gate of the second input transistor during a first period; and electrically disconnect the gate of the first input transistor and the gate of the second input transistor from the common gate of the at least one second intermediate transistor and the common gate of the second intermediate transistor during a second period that follows the first period, and wherein the second period begins with a change in the input voltage.

12. The operational amplifier of claim 8, wherein the second switch is configured to:

electrically disconnect the common gate of the at least one second intermediate transistor and the common gate of the at least one second intermediate transistor from the output node during a first period; and electrically connect the common gate of the at least one first intermediate transistor and the common gate of the at least one second intermediate transistor to the output node during a second period that follows the first period, wherein the second period begins with a change in the input voltage.

13. A method to control input capacitance in an amplifier circuit, comprising:

generating a first current through a first output transistor having a gate coupled to an output node;

generating a second current through the at least one first intermediate transistor each having a common gate node;

generating a third current through an input transistor having a gate coupled to an input voltage, the sources of the first output transistor, the at least one first intermediate transistors and the first input transistor being coupled to a load device;

driving the output voltage on the output node based on the first current, the second current, and the third current;

electrically connecting the common gate node of the at least one first intermediate transistors to the gate of the input transistor during a first period; and electrically connecting the common gate node of the at least one first intermediate transistors to the output node during a second period that follows the first period, wherein the second period begins with a change in the input voltage.

14. The method of claim 13, further comprising:

electrically disconnecting the common gate of the at least one first intermediate transistor from the output node during the first period; and electrically disconnecting the common gate of the at least one first intermediate transistor to the gate of the first input transistor during the second period.

\* \* \* \* \*

UNITED STATES PATENT AND TRADEMARK OFFICE
CERTIFICATE OF CORRECTION

PATENT NO. : 11,456,715 B1
APPLICATION NO. : 17/565370
DATED : September 27, 2022
INVENTOR(S) : Yutaka Saeki It is certified that error appears in the above-identified patent and that said Letters Patent is hereby corrected as shown below:

On the Title Page

Item (57) ABSTRACT, Line 10, the words "intermediate transistors" should read -- intermediate transistor --.

Item (57) ABSTRACT, Line 16, the word "transistors" should read -- transistor --.

In the Claims

At Column 13, Claim 1, Lines 4-5, the word "transistors" should read -- transistor --.

At Column 13, Claim 1, Line 12, the word "transistors" should read -- transistor --.

At Column 14, Claim 8, Line 7, the word "on" should read -- one --.

At Column 14, Claim 8, Line 11, the word "transistors" should read -- transistor --.

At Column 14, Claim 13, Line 61, the word "transistors" should read -- transistor --.

At Column 14, Claim 13, Line 66, the word "transistors" should read -- transistor --.

At Column 15, Claim 13, Line 2, the word "transistors" should read -- transistor --.

Signed and Sealed this
Fourth Day of July, 2023

Katherine Kelly Vidal
*Director of the United States Patent and Trademark Office*